United States Patent
Burnham et al.

(10) Patent No.: US 8,912,091 B2
(45) Date of Patent: Dec. 16, 2014

(54) BACKSIDE METAL GROUND PLANE WITH IMPROVED METAL ADHESION AND DESIGN STRUCTURES

(71) Applicant: International Business Machines Corporation, Armonk, NY (US)

(72) Inventors: Jay S. Burnham, Franklin, VT (US); Damyon L. Corbin, Jericho, VT (US); George A. Dunbar, III, Essex Junction, VT (US); Jeffrey P. Gambino, Westford, VT (US); John C. Hall, New Hartford, CT (US); Kenneth F. McAvey, Jr., Winooski, VT (US); Charles F. Musante, South Burlington, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/738,541

(22) Filed: Jan. 10, 2013

(65) Prior Publication Data
US 2014/0191408 A1    Jul. 10, 2014

(51) Int. Cl.
| | |
|---|---|
| H01L 21/4763 | (2006.01) |
| H01L 29/40 | (2006.01) |
| H01L 23/498 | (2006.01) |
| H01L 21/768 | (2006.01) |
| G06F 17/50 | (2006.01) |

(52) U.S. Cl.
CPC .... *H01L 21/76877* (2013.01); *H01L 23/49827* (2013.01); *G06F 17/50* (2013.01)

USPC ........... 438/629; 437/637; 437/672; 437/675; 257/621; 257/774; 257/E21.597

(58) Field of Classification Search
USPC .......... 257/621, 774, E21.597; 438/629, 630, 438/637–640, 668, 672, 675
See application file for complete search history.

(56) References Cited

U.S. PATENT DOCUMENTS

| | | | |
|---|---|---|---|
| 6,225,651 B1 * | 5/2001 | Billon | 257/200 |
| 6,261,632 B1 | 7/2001 | Andolfatto | |
| 6,803,309 B2 | 10/2004 | Chou et al. | |
| 7,208,396 B2 | 4/2007 | Felmetsger | |
| 7,518,240 B2 | 4/2009 | Collins et al. | |

(Continued)

FOREIGN PATENT DOCUMENTS

| | | |
|---|---|---|
| JP | 10163467 | 6/1998 |
| WO | 2008027215 A2 | 6/2008 |

OTHER PUBLICATIONS

Stamper et al., "Through Wafer Via Integration in CMOS and BiCMOS Technologies", IBM Microelectronics, 6 pages, 2008.

(Continued)

*Primary Examiner* — Jasmine Clark
(74) *Attorney, Agent, or Firm* — David Cain; Roberts Mlotkowski Safran & Cole, P.C.

(57) ABSTRACT

A backside metal ground plane with improved metal adhesion and methods of manufacture are disclosed herein. The method includes forming at least one through silicon via (TSV) in a substrate. The method further includes forming an oxide layer on a backside of the substrate. The method further includes forming a metalized ground plane on the oxide layer and in electrical contact with an exposed portion of the at least one TSV.

23 Claims, 4 Drawing Sheets

(56) References Cited

U.S. PATENT DOCUMENTS

| | | |
|---|---|---|
| 7,655,539 B2 | 2/2010 | Hendricks et al. |
| 8,003,532 B2 | 8/2011 | Hua et al. |
| 8,039,314 B2 | 10/2011 | DeGraw et al. |
| 2009/0026619 A1 | 1/2009 | Zeng et al. |
| 2010/0029088 A1 | 2/2010 | Mayer et al. |
| 2010/0140805 A1 | 6/2010 | Chang et al. |
| 2010/0164109 A1 | 7/2010 | Chiou et al. |
| 2010/0167543 A1 | 7/2010 | Kim |
| 2011/0020982 A1 | 1/2011 | Wimplinger |
| 2012/0038020 A1 | 2/2012 | Lin et al. |
| 2012/0077349 A1 | 3/2012 | Li et al. |
| 2012/0146238 A1 | 6/2012 | Su |
| 2012/0212303 A1 | 8/2012 | Ding et al. |
| 2012/0295437 A1 | 11/2012 | Lu et al. |
| 2012/0319250 A1 | 12/2012 | Schmitt et al. |
| 2013/0005109 A1 | 1/2013 | Dao et al. |

OTHER PUBLICATIONS

Kinbara et al., "Evaluation of Adhesion Strength of Ti Films on Si(100) by the Internal Stress Method", Thin Solid Films, vol. 317 Issues Apr. 1-2, 1998, pp. 165-168.

Kondo et al., "Effects of Different Pretreatments on the Surface Structure of Silicon and the Adhesion of Metal Films", JVST, A10(5), Sep./Oct. 1992, pp. 3166-3170.

Kondo et al., "Interface Structure and Adhesion of Sputtered Metal Films on Silicon: The Influence of Si Surface Condition", JVST, A11(2), Mar./Apr. 1993, pp. 319-324.

Specification and drawings for U.S. Appl. No. 13/683,050, filed Nov. 21, 2012, not yet published, 25 pages.

International Search Report and Written Opinion for the related PCT Application No. PCT/US2014/010960 dated May 2, 2014, 9 pages.

\* cited by examiner

BACKSIDE METAL GROUND PLANE WITH IMPROVED METAL ADHESION AND DESIGN STRUCTURES

FIELD OF THE INVENTION

The invention relates to semiconductor structures and, more particularly, to backside metal ground planes with improved metal adhesion, methods of manufacture and design structures.

BACKGROUND

Packaging lead inductance is a major design issue, particularly for RF analog chips such as WLAN power amplifiers (PA). For example, the emitter ground leads used in SiGe heterojunction bipolar transistor (HBT) RF designs are normally contacted to the package either using multiple wire bonds or flip chip solder bumps. Wire bond package ground leads have high inductance, on the order of 160 pH, which results in unacceptable PA insertion loss. Although flip chip solder bumps have low inductance, they increase packaging complexity and are expensive.

Accordingly, there exists a need in the art to overcome the deficiencies and limitations described hereinabove.

SUMMARY

In an aspect of the invention, a method comprises forming at least one through silicon via (TSV) in a substrate. The method further comprises forming an oxide layer on a backside of the substrate. The method further comprises forming a metalized ground plane on the oxide layer and in electrical contact with an exposed portion of the at least one TSV.

In an aspect of the invention, a method comprises forming a plurality of through silicon vias (TSVs) in a substrates. The TSVs are formed by: forming openings partially within the substrate; filling the openings with a metal; and thinning the substrate to expose a backside of the metal within the via, such that the metal via extends entirely through the substrate. The thinning process results in an oxide layer formed on a backside of the substrate. The method further comprises forming a backside metal on the oxide layer such that the backside metal is in direct contact with the plurality of TSVs and the oxide layer.

In an aspect of the invention, a structure comprises a substrate comprising at least one through silicon via extending entirely through the substrate. The structure further comprises an oxide layer on a backside of the substrate. The structure further comprises a metalized ground plane on a backside of the substrate, directly in contact with metal of the at least one through silicon via and the oxide layer on the backside.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the backside metal ground planes, which comprises the structures of the present invention. In still further embodiments, a method in a computer-aided design system is provided for generating a functional design model of the backside metal ground planes.

The method comprises generating a functional representation of the structural elements of the backside metal ground planes.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
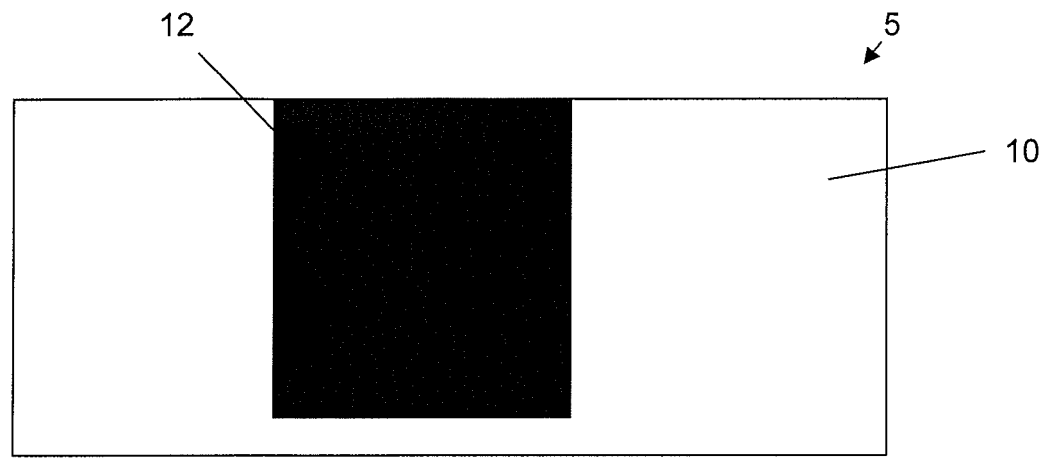
FIG. 1 shows a structure and processing steps in accordance with aspects of the present invention.

The invention relates to semiconductor structures and, more particularly, to backside metal ground planes with improved metal adhesion and methods of manufacture. More specifically, the present invention relates to structures and methods of forming backside metal on a Si substrate (Si wafer). In more specific embodiments, the backside metal is formed on an oxide material, e.g., SiOx, preferably formed from a thinning process performed on the Si wafer. For example, the oxide material can be formed on a backside of a Si wafer by a grinding and polishing process, when forming a through silicon via (TSV).

In embodiments, the backside metal, e.g., Ti, can be formed without an Argon (Ar) sputter, as compared with conventional fabrication processes, resulting in a metal-Si interface that is partially oxidized. In embodiments, the fabrication process can include a Ar sputter to remove some impurities formed on the TSV, which would form thereon during the thinning process. In embodiments, though, the Ar sputter would be a low energy Ar sputter in order to ensure oxide remains at the interface of the backside metal and the Si wafer. In alternative or additional embodiments, the oxide on the backside of the Si wafer can be formed by a deposition process or low temperature thermal oxidation process. This improved adhesion will reduce peeling stresses and fold over issues of the backside metal for example.

In embodiments, the oxide material provides improved metal adhesion on the backside of the Si wafer, compared to conventional devices and fabrication processes. More specifically, it has been found that the presence of oxygen at the interface of the Si wafer and metal, and the absence of any significant amounts of Ar, greatly improves the metal adhesion to the backside of the Si wafer.

As should be understood by those of skill in the art, grounded TSVs can be used to reduce ground lead inductance and reduce the bond pad area on the chip surface. In such implementations, a metal is blanket deposited directly on the backside of the substrate, after a cleaning process, to act as a ground plane. However, in such implementations, problems with metal adhesion are commonly observed during dicing. That is, the dicing process introduces a large peeling stress at the metal-Si interface, which can cause the metal to peel from the corners and edges of the die. Often, the peeled metal "folds over", which results in a very non-planar surface on the back of the die, which can cause problems with die yield and reliability.

Advantageously, though, the present invention solves the metal peeling problem by using a backside metal ground plane, which, in embodiments, is deposited on an oxide layer. This allows the wafer to be diced without affecting the backside metal, thereby forming dies with a planar backside metal ground plane. The backside metal ground plane can be formed with minimal additional cost. Also, in embodiments, the use of the backside metal will reduce ground lead inductance and chip area that ordinarily occurs with wirebonding substrate designs.

FIG. 1 shows a structure and respective fabrication processing in accordance with aspects of the invention. More specifically, FIG. 1 shows a structure 5 comprising a substrate (e.g., wafer) 10 having at least one via 12. It should be understood that the structure equally represents a plurality of dies, each having a plurality of through silicon vias. Although a single via 12 is shown, it should be understood by those of ordinary skill in the art that a plurality of vias can be formed within the wafer, and that a single via is described herein for simplicity of discussion. In embodiments, the wafer 10 is an Si wafer, and the via 12 is a metal via formed partially through the wafer 10.

In embodiments, the via 12 can be formed using conventional lithography, etching and deposition processes. As one specific example, a via can be formed in a front side of the wafer 10 by forming a resist on the wafer 10, exposing the resist to energy, e.g., UV light, to form a pattern (openings), and etching the wafer 10 through the openings. The via would typically extend only partially through the wafer 10. After formation of the via, metal can be deposited therein using conventional deposition processes such as, for example, electroplating or chemical vapor deposition techniques. In embodiments, the metal can be any appropriate metal used in semiconductor manufacturing processes for TSVs such as, for example, copper or tungsten.

Figure 2A:
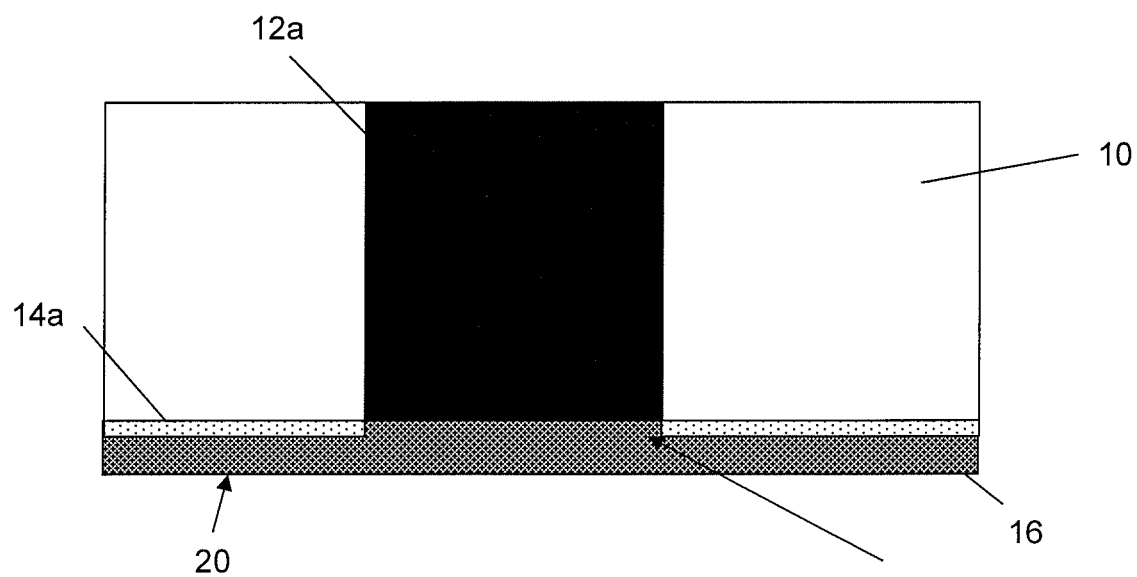
FIGS. 2a, 2b and 2c show various structures and respective processing steps for manufacturing backside metal on a Si wafer, in accordance with aspects of the present invention.

As shown in FIG. 2a, the backside of the wafer 10 then undergoes a thinning process, e.g., a polishing and grinding process, to expose the TSVs 12a. In embodiments, the polishing and grinding process can comprise an Si etching process, as described herein. In FIG. 2a, the Si etching process has a slow Si etch rate which forms an oxide layer 14 on the backside of the wafer 10. For example, the Si etch can be a wet chemical etch using nitric acid, which will form the oxide layer 14. In embodiments, the oxide layer 14 can be SiOx, where x is between 1 and 2. Also, in embodiments, the oxide layer 14 can have a thickness of about 1 nm to about 10 nm, resulting in a slight recess 18a of the TSVs 12a.

In alternate or additional embodiments, the oxide layer 14 can be formed by an oxide deposition process, e.g., oxygen plasma. Also, in alternate or additional embodiments, the oxide layer 14 can be formed by a low temperature thermal oxidation process at 100° C., in air. In any of the embodiments, oxide formed on the metal of the TSV 12a can be cleaned using, e.g., a low energy Ar sputter process. In embodiments, the dose of the low energy Ar sputter process can be, e.g., less than or equal to about $3E14\ cm^{-2}$. In embodiments, such a low energy Ar sputter process is designed to remove contaminants from the metal surface of the TSV, while leaving a significant amount of the oxide layer 14 on the backside of the wafer 10.

Still referring to FIG. 2a, a backside metal (e.g., metalized ground plane) 16 is deposited directly on the oxide layer 14 and exposed portion of the TSV 12a, including with the recess 18a. In this way, the oxide layer 14 will be at an interface of the backside metal 16 and the Si wafer 10, resulting in improved metal adhesion of the backside metal 16 (compared to conventional structures in which the backside metal 16 is formed directly on the backside of the Si wafer, after a cleaning process). As in all of the embodiments, due to the improved adhesion properties of the backside metal 16, the backside metal 16 can be deposited within the dicing channel, but dicing of the wafer 10 will not result in the backside metal 16 peeling or folding over (as in conventional structures).

The backside metal 16 can be, for example, Ti or other backside metal, e.g., copper or gold, with a titanium diffusion layer, formed using conventional fabrication processes, e.g., sputter deposition method; although other deposition methods and metals are contemplated by the present invention, e.g., chemical vapor deposition, etc. In any of the deposition processes and embodiments described herein, the backside metal 16 can have a planar surface 20, which can be formed by the deposition process or through additional processing such as, for example, chemical mechanical polishing (CMP).

Figure 2B:
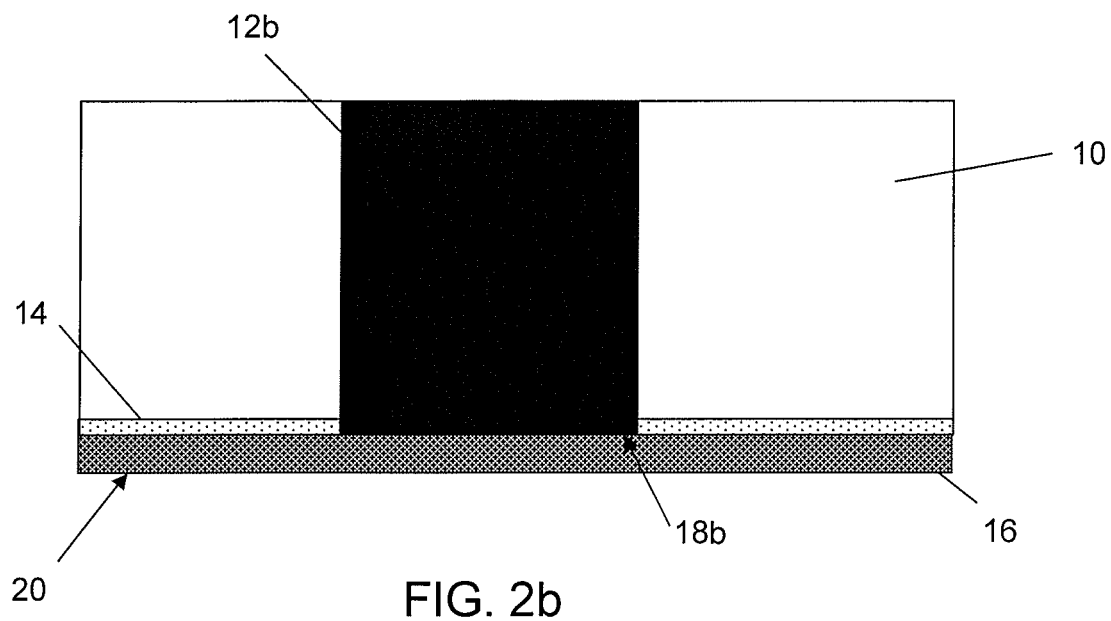

In an alternative embodiment, as shown in FIG. 2b, the backside of the wafer 10 can undergo a thinning process, e.g., a polishing and grinding process, which results in the TSV 12b being planar or substantially planar with the oxide layer 14, as represented by reference numeral 18b. As in FIG. 2a, the polishing and grinding process can comprise a Si etching process which forms the oxide layer 14. In the embodiment shown in FIG. 2b, though, the Si etching process has an intermediate Si etch rate, which will form the oxide layer 14 in a planar arrangement with the exposed portion of the TSV 12b. In embodiments, the oxide layer 14 can be SiOx, where x is between 1 and 2.

As noted herein, in embodiments, the oxide layer 14 can have a thickness of about 1 nm to about 10 nm. The oxide layer 14 can also be formed by an oxide deposition process, e.g., oxygen plasma, or a low temperature thermal oxidation process at 100° C. in air, as described with respect to FIG. 2a. Moreover, oxide formed on the metal of the TSV 12b can be cleaned using, e.g., a low energy Ar sputter process, e.g., less than or equal to about $3E14\ cm^{-2}$.

Still referring to FIG. 2b, the backside metal 16 is deposited directly on the oxide layer 14 and exposed portion of the TSV 12b. The backside metal 16 can be, for example, Ti or other appropriately used backside metal, e.g., copper or gold, with a titanium diffusion layer, formed using conventional fabrication processes, e.g., sputter deposition method; although other deposition methods and metals are contemplated by the present invention, e.g., chemical vapor deposition, etc. In embodiments, the oxide layer 14 provides improved metal adhesion, compared to conventional devices in which the backside metal 16 is formed directly on the backside of the Si wafer, after a cleaning process.

Figure 2C:
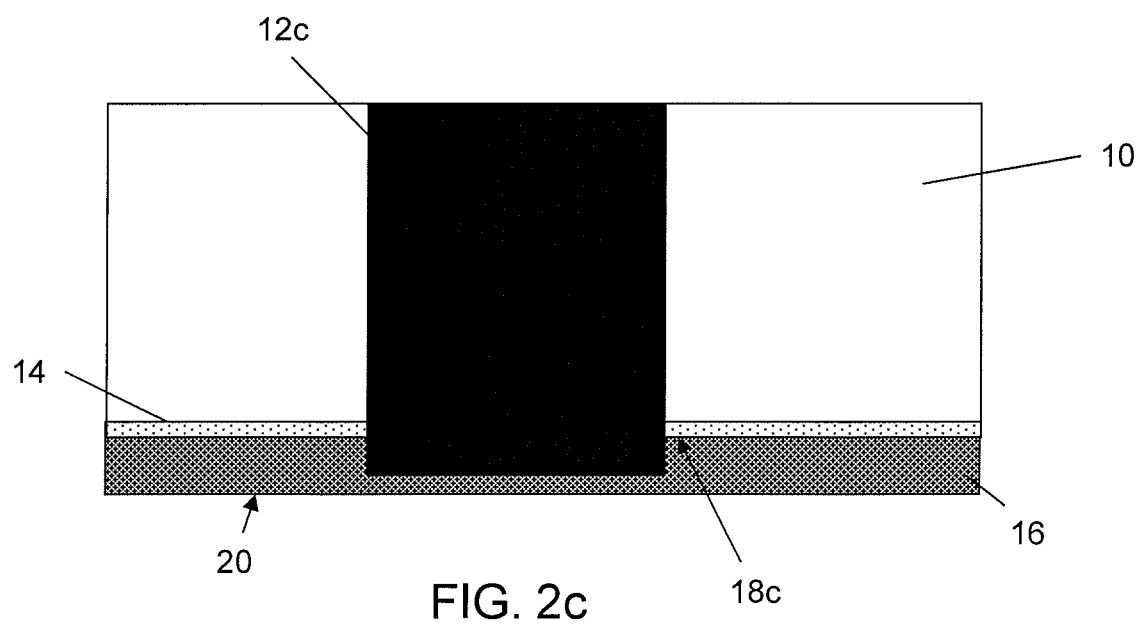

In an alternative embodiment, as shown in FIG. 2c, the backside of the wafer 10 undergoes a thinning process, e.g., a polishing and grinding process, resulting in a recess 18c of the Si wafer 10 with respect to the TSV 12c. This recess is the result of a high silicon etch rate, e.g., wet chemical etch using nitric acid, acetic acid, and hydrofluoric acid. As in the previous embodiments, the oxide layer 14 can be SiOx, where x is between 1 and 2. Also, in embodiments, the oxide layer 14 can have a thickness of about 1 nm to about 10 nm, and can additionally or alternatively be formed by an oxide deposition process, e.g., oxygen plasma, or a low temperature thermal oxidation process at 100° C. in air. As in any of the embodiments, oxide formed on the metal of the TSV 12c can be cleaned using, e.g., a low energy Ar sputter process, e.g., less than or equal to about $3E14\ cm^{-2}$.

Still referring to FIG. 2c, the backside metal 16 is deposited directly on the oxide layer 14 and exposed portion of the TSV 12c. The backside metal 16 can be, for example, Ti or other appropriately used backside metal, e.g., copper or gold, with a titanium diffusion layer, formed using conventional fabrication processes, e.g., sputter deposition method; although other deposition methods and metals are contemplated by the present invention, e.g., chemical vapor deposition, etc. In embodiments, the oxide layer 14, which acts as an interface, will provide improved metal adhesion of the backside metal 16 on the oxide layer 14 (compared to conventional devices in which the backside metal 16 is formed directly on the backside of the Si wafer, after a cleaning process).

Figure 3:
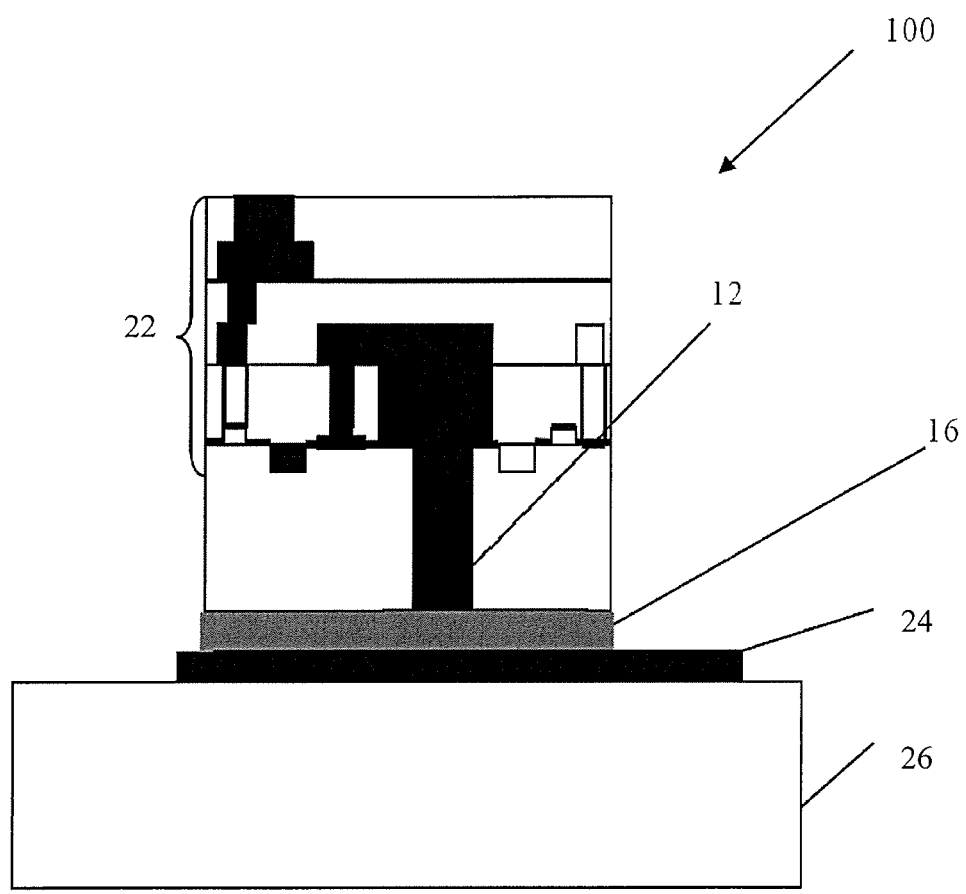
FIG. 3 shows a packaged module with a backside metal ground plane attached to a substrate in accordance with aspects of the present invention.

FIG. 3 shows a packaged module with a backside metal ground plane attached to a substrate in accordance with aspects of the present invention. More specifically, in any of the above embodiments, the wafer 10 is diced using a mechanical or laser cutting process in order to form separate chips or dies. The dies are then formed into a device 100, comprising a plurality of metal wiring layers 22, one of which is at least in electrical communication with the TSV 12. The wiring layers 22 can include vias, wires, and a host of different active or passive devices, any combination of which is contemplated by the present invention. The TSV 12 is, in turn, in mechanical and electrical communication with the backside metal 16. In embodiments, the backside metal 16 has a planar surface, which connects to a substrate ground plane 24. The substrate ground plane 24 is bonded to the substrate 26. In embodiments, the construction of the device 100 does not require wirebonding techniques.

Figure 4:
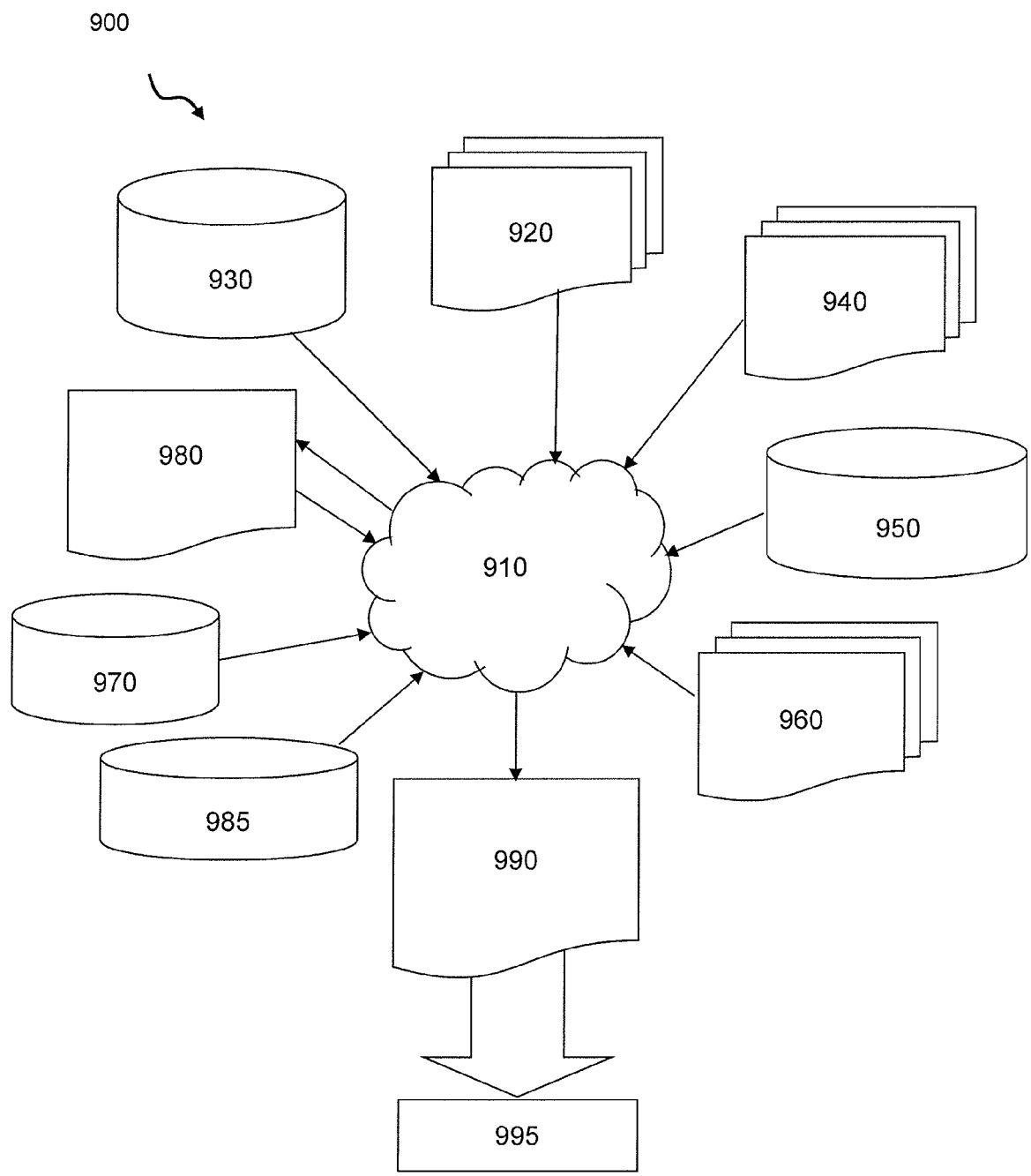
FIG. 4 is a flow diagram of a design process used in semiconductor design, manufacture, and/or test.

FIG. 4 is a flow diagram of a design process used in semiconductor design, manufacture, and/or test. FIG. 4 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1, 2a, 2b, 2c and 3. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 4 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1, 2a, 2b, 2c and 3. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1, 2a, 2b, 2c and 3 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1, 2a, 2b, 2c and 3. In one embodiment, design structure 990 may comprise a compiled, executable HDL simulation model that functionally simulates the devices shown in FIGS. 1, 2a, 2b, 2c and 3.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 2a, 2b, 2c and 3. Design structure 990 may then proceed to a stage 995 where, for example, design structure 990: proceeds to tape-out, is released to manufacturing, is released to a mask house, is sent to another design house, is sent back to the customer, etc.

The methods as described above are used in the fabrication of integrated circuit chips. The resulting integrated circuit chips can be distributed by the fabricator in raw substrate form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method comprising:
   forming at least one through silicon via (TSV) in a substrate;
   forming an oxide layer on a backside of the substrate; and
   forming a metalized ground plane on the oxide layer and in electrical contact with an exposed portion of the at least one TSV,
   wherein the forming of the metalized ground plane eliminates peeling when the substrate is diced.

2. The method of claim 1, wherein the forming the metalized ground plane comprises depositing a metal on a backside of the wafer, in direct contact with the at least one TSV and the oxide layer.

3. The method of claim 1, wherein the oxide layer forms a recessed portion, exposing a metal of the at least one TSV.

4. The method of claim 1, wherein the forming the at least one TSV forms a planar or substantially planar surface with an exposed portion of the at least one TSV and the oxide layer.

5. The method of claim 1, wherein the oxide layer is SiOx, where x is between 1 and 2.

6. A method comprising:
   forming at least one through silicon via (TSV) in a substrate;
   forming an oxide layer on a backside of the substrate; and
   forming a metalized ground plane on the oxide layer and in electrical contact with an exposed portion of the at least one TSV,
   wherein the forming the at least one TSV comprises a polishing and grinding process of the substrate, which forms the oxide layer.

7. The method of claim 6, wherein the forming the oxide layer comprises a Si etch using a wet chemistry of hydrogen peroxide.

8. A method comprising:
   forming at least one through silicon via (TSV) in a substrate;
   forming an oxide layer on a backside of the substrate; and
   forming a metalized ground plane on the oxide layer and in electrical contact with an exposed portion of the at least one TSV,
   wherein the forming the oxide layer comprises an oxide deposition process using oxygen plasma.

9. A method comprising:
   forming at least one through silicon via (TSV) in a substrate;
   forming an oxide layer on a backside of the substrate; and
   forming a metalized ground plane on the oxide layer and in electrical contact with an exposed portion of the at least one TSV,
   wherein the forming the oxide layer comprises a low temperature thermal oxidation process at 100° C., in air.

10. A method comprising:
    forming at least one through silicon via (TSV) in a substrate;
    forming an oxide layer on a backside of the substrate;
    forming a metalized ground plane on the oxide layer and in electrical contact with an exposed portion of the at least one TSV; and cleaning impurities from exposed portions of the at least one TSV, using a low energy Ar sputter process.

11. The method of claim 10, wherein the low energy Ar sputter process has an energy level of less than or equal to about $3E14\ cm^{-2}$.

12. A method comprising:
forming at least one through silicon via (TSV) in a substrate;
forming an oxide layer on a backside of the substrate; and
forming a metalized ground plane on the oxide layer and in electrical contact with an exposed portion of the at least one TSV,
wherein the forming the at least one TSV forms a recessed portion of the substrate, adjacent to the at least one TSV.

13. A method comprising:
forming a plurality of through silicon vias (TSVs) in a substrate, comprising:
  forming openings partially within the substrate;
  filling the openings with a metal; and
  thinning the substrate to expose a backside of the metal within the via, such that the metal via extends entirely through the substrate, wherein the thinning process results in an oxide layer formed on a backside of the substrate; and
forming a backside metal on the oxide layer such that the backside metal is in direct contact with the plurality of TSVs and the oxide layer.

14. The method of claim 13, wherein the oxide layer is SiOx, where x is between 1 and 2.

15. The method of claim 13, wherein:
the forming the backside metal comprises depositing a metal on a backside of the substrate; and
the thinning of the substrate comprises a Si etch using a wet chemistry of hydrogen peroxide.

16. The method of claim 13, wherein the forming the oxide layer is further formed by an oxide deposition process using oxygen plasma.

17. The method of claim 13, wherein the oxide layer is further formed by a low temperature thermal oxidation process at 100° C., in air.

18. The method of claim 13, further comprising cleaning impurities from exposed portions of the plurality of TSVs, using a low energy Ar sputter process.

19. The method of claim 18, wherein the low energy Ar sputter process has an energy level of less than or equal to about $3E14\ cm^{-2}$.

20. The method of claim 13, wherein the backside metal is planar.

21. The method of claim 20, wherein the backside metal is planarized using a chemical mechanical polish.

22. The method of claim 13, further comprising:
dicing the substrate to form a plurality of chips, each of which include at least one of the TSVs and the backside metal; and
bonding at least one of the plurality of chips to a substrate by the backside metal.

23. A structure, comprising:
a substrate comprising at least one through silicon via extending entirely through the substrate;
an oxide layer on a backside of the substrate;
a recessed portion of the substrate adjacent to the at least one through silicon via; and
a metalized ground plane on a backside of the substrate, directly in contact with metal of the at least one through silicon via and the oxide layer on the backside.

* * * * *